United States Patent [19]
Perlov

[11] Patent Number: 5,421,893
[45] Date of Patent: Jun. 6, 1995

[54] SUSCEPTOR DRIVE AND WAFER DISPLACEMENT MECHANISM

[75] Inventor: Ilya Perlov, Santa Clara, Calif.

[73] Assignee: Applied Materials, Inc., Santa Clara, Calif.

[21] Appl. No.: 159,062

[22] Filed: Nov. 29, 1993

Related U.S. Application Data

[63] Continuation of Ser. No. 23,844, Feb. 26, 1993, abandoned.

[51] Int. Cl.$^6$ .............................................. C23C 16/00
[52] U.S. Cl. .................................... 118/725; 118/729; 118/730
[58] Field of Search ......................... 118/725, 729, 730

[56] References Cited

U.S. PATENT DOCUMENTS

| | | | |
|---|---|---|---|
| 4,724,621 | 2/1988 | Hobson | 118/725 |
| 5,000,113 | 3/1991 | Wang | 118/729 |
| 5,044,943 | 9/1991 | Bowman | 118/725 |
| 5,094,885 | 3/1992 | Selbrede | 118/725 |
| 5,117,769 | 6/1992 | de Boer | 118/725 |
| 5,135,635 | 8/1992 | Ikeda | 118/729 |

*Primary Examiner*—Richard Bueker
*Attorney, Agent, or Firm*—Craig P. Opperman; Peter J. Sgarbossa

[57] ABSTRACT

A thermal reaction chamber for semiconductor wafer processing operations comprising:

(i) a susceptor for supporting a semiconductor wafer within the chamber and having a plurality of apertures formed vertically therethrough;

(ii) displacer means for displacing the susceptor vertically between at least a first and a second position;

(iii) a plurality of wafer support elements, each of which is suspended to be vertically moveable within said apertures and each of which extends beyond the underside of the susceptor; and (iv) means for restricting the downward movement of the wafer support elements. As the susceptor is displaced from its first position through an intermediate position before the second position, the means for restricting operate to stop the continued downward movement of the wafer support elements thereby causing the elements to move vertically upwards with respect to the downwardly moving susceptor and separate the wafer from the susceptor.

27 Claims, 5 Drawing Sheets

SUSCEPTOR DRIVE AND WAFER DISPLACEMENT MECHANISM

This is a continuation of application Ser. No. 08/023,844 filed on Feb. 26, 1993, now abandoned.

BACKGROUND OF THE INVENTION

1. Field of the Invention

This invention relates to thermal reactors used in semiconductor wafer processing operations and, more particularly, to a mechanism for rotating and vertically displacing a susceptor and for assisting the removal of a wafer from the thermal reactor.

2. Background

Semiconductor wafers are usually processed in a thermal reactor. To accomplish this, the wafer is inserted into the reactor, by means of a robot arm, and placed to rest on a graphite susceptor. The wafer is then processed and, once the processing operation is completed, the robot arm removes the wafer from the susceptor and reactor.

The manner in which the wafer has been transferred to and from the susceptor in the past is illustrated in FIG. 1. This figure is a schematic cross-section through a portion of a semiconductor thermal reactor 10 with a wafer 12 shown to be resting on a susceptor 14. For purposes of clarity the lower portion of the thermal reactor 10, the susceptor drive mechanism and the dome-shaped upper quartz window are not shown.

To initiate the wafer transfer operation the susceptor 14 moves downwards, in a two-step process. During the first of these steps, the susceptor 14 together with a wafer support cradle 16 which is located below the susceptor, move down to a lower position represented by the cradle shown in broken lines 16'. Then, during the second of these steps and with the cradle 16 remaining stationary, the susceptor moves further down to a lower position 14' also represented in broken lines. As a result wafer support pins 18, which are located in holes 20 formed through the susceptor 14, move through the susceptor and support the wafer 12 at a position 12'. This position 12' is some distance above the susceptor's lower position 14' but still below the position of the wafer before the transfer operation was commenced. The space betweens the wafer 12 and the susceptor 14 in this lowered configuration is sufficient to allow a robot arm (not illustrated) to access the chamber and move into position below the wafer.

Thereafter, both the susceptor 14 and the cradle 16 are together moved further down until the wafer 12 is supported entirely by the robot arm and clear of the wafer support pins 18 whereupon the robot arm removes the wafer from the thermal reactor 10.

To ensure uniform heating and distribution of reactant gases across the surface of the wafer 12, the susceptor 14 is rotated during the processing operation. Unfortunately, certain problems are associated with the arrangement as illustrated in FIG. 1 and, particularly, with the rotation of the susceptor 14.

As is shown in this figure, the wafer support pins 18 are located within holes 20 formed through the body of the susceptor 14. This means that the cradle 16 must be rotated at exactly the same speed as the susceptor is. If not, the support pins 18 bear against the inner walls of the holes 20 and cause abrasion which, in turn, results in particles which can contaminate the processing environment within the thermal reactor 10. As it is well known that contaminates within a semiconductor processing reactor 10 can be very detrimental to the quality of a processed semiconductor wafer, it will be apparent that the contaminating particles produced by this abrasion is unacceptable in certain wafer processing operations.

The problem of contaminating particles is further compounded by the fact that the susceptor 14 is made of graphite and the cradle 16 typically of stainless steel or quartz. Because of these different materials of construction, different rates of thermal expansion exist for the susceptor 14 and the cradle 16. Given that the processing temperatures within the thermal reactor 10 can exceed 1,000° C., these differences in expansion are not insignificant. It therefore becomes impossible to position the pins 18 accurately within the holes 20. As a result, at certain temperatures, the pins 18 bear strongly against the inner walls of the holes 20 which further contributes to the abrasion described above and thereby adds to the number of particles which are generated.

A further problem associated with the illustrated apparatus results from the fairly large tolerance between the diameter of the support pins 18 and the holes 20. This large tolerance is necessary to maintain the alignment between the pins 18 and the holes 20 and to reduce, as far as possible, the abrasion effects described above. However, as a result of these tolerances, a space exists between the pin 18 and the inside wall of the hole 20. Processing gases from within the thermal reactor 10 are therefore able to pass between the pin and the inner wall of the hole 20 and mark or "burn" the back side of the wafer 12. This burning of the wafer 12 is, under certain circumstances, unacceptable from a quality control point of view and is, therefore, highly undesirable.

From the above, therefore, it is apparent that the need exists for a mechanism which can rotate the susceptor and displace the wafer therefrom which results in the minimum amount of contamination within the thermal reactor and, at the same time, reduces the amount of burn on the back side of the wafer.

SUMMARY OF THE INVENTION

Accordingly, this invention provides for a thermal reaction chamber for semiconductor wafer processing operations which comprises:

(i) a susceptor for supporting a semiconductor wafer within the chamber and having a plurality of apertures formed vertically therethrough;

(ii) displacer means for displacing the susceptor vertically between at least a first and a second position;

(iii) a plurality of wafer support elements, each of which is suspended to be vertically moveable within said apertures and each of which extends beyond the underside of the susceptor; and (iv) means for restricting the downward movement of the wafer support elements.

As the susceptor is displaced from its first position through an intermediate position before the second position, the means for restricting operate to stop the continued downward movement of the wafer support elements thereby causing the elements to move vertically upwards with respect to the downwardly moving susceptor and separate the wafer from the susceptor.

The apparatus also includes drive means for rotating the susceptor.

The displacer means is operable to displace the cradle vertically downward whilst simultaneously displacing the susceptor from the second position to a third, lower position. Each wafer support pin has an enlarged frusto-conical head which is received in a complementally shaped portion of the aperture in the susceptor, so that when the susceptor is in its first position, the frusto-conical head seals against the interior of the enlarged portion of the aperture and substantially prevents the movement of semiconductor wafer processing gases through the apertures.

ADVANTAGES OF THE INVENTION

One advantage of this invention is that it provides a susceptor drive and wafer displacement mechanism which reduces the amount of contaminating particles produced by abrasion of the susceptor.

A further advantage of this invention is that the wafer displacement mechanism shuts off all the holes through the susceptor, thereby reducing the burning of the back side of the wafer during processing.

Yet another advantage of this invention is that the wafer support pins hang loosely from the susceptor and are not rigidly mounted to the cradle and in so doing the extent of abrasion, caused by differential expansion of the components of the mechanism, is reduced.

These and other advantages of the present invention will no doubt become apparent to those skilled in the art after having read the following detailed description of the preferred embodiment which is illustrated in the several figures of the drawing.

DESCRIPTION OF THE DRAWINGS

In the Accompanying Drawings

DESCRIPTION OF A PREFERRED EMBODIMENT

Figure 1:
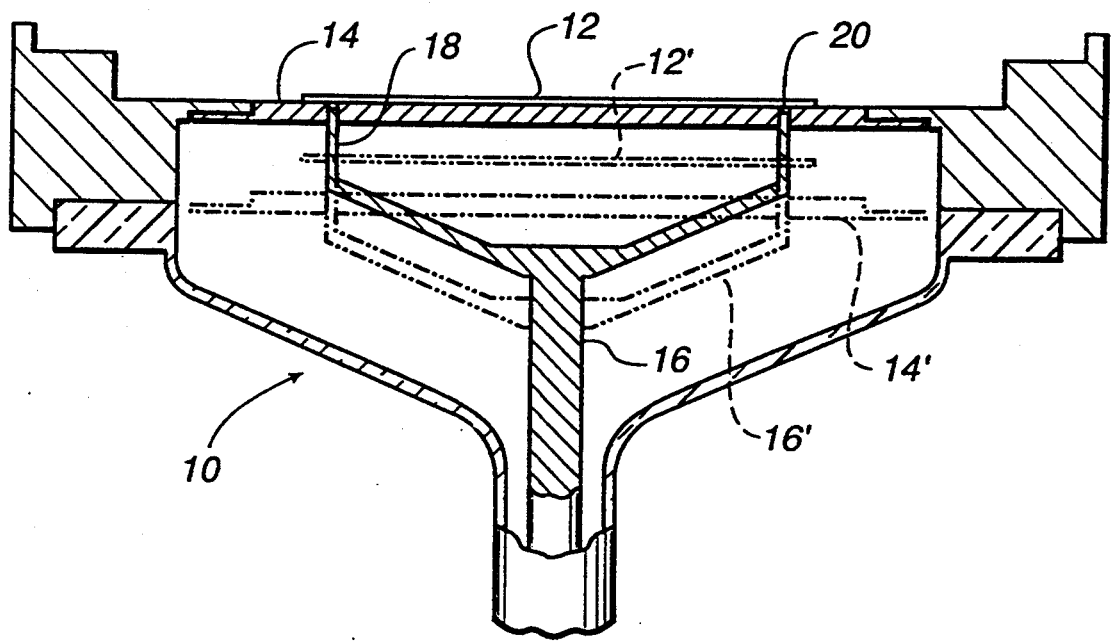
FIG. 1 is a cross-section through a schematic representation of part of a thermal reactor illustrating the problems of the prior art.
Figure 2B:
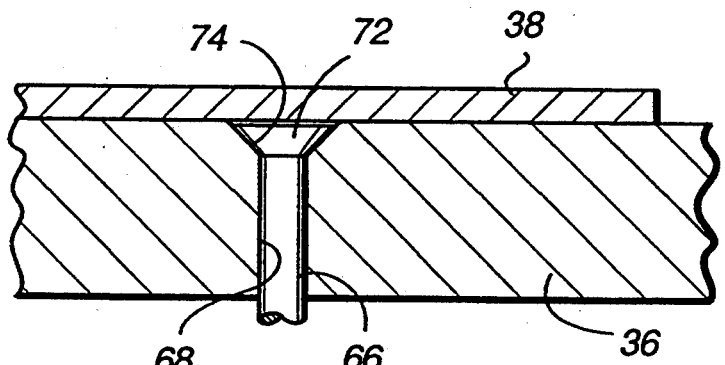
FIG. 2(b) is a detail of the circled area in FIG. 2(a)
Figure 2C:
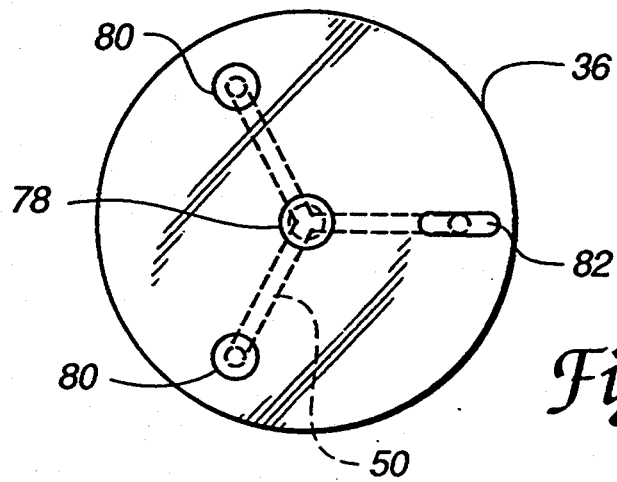
FIG. 2(c) is a plan view of the bottom of the susceptor shown in FIG. 2(a)
Figure 2A:
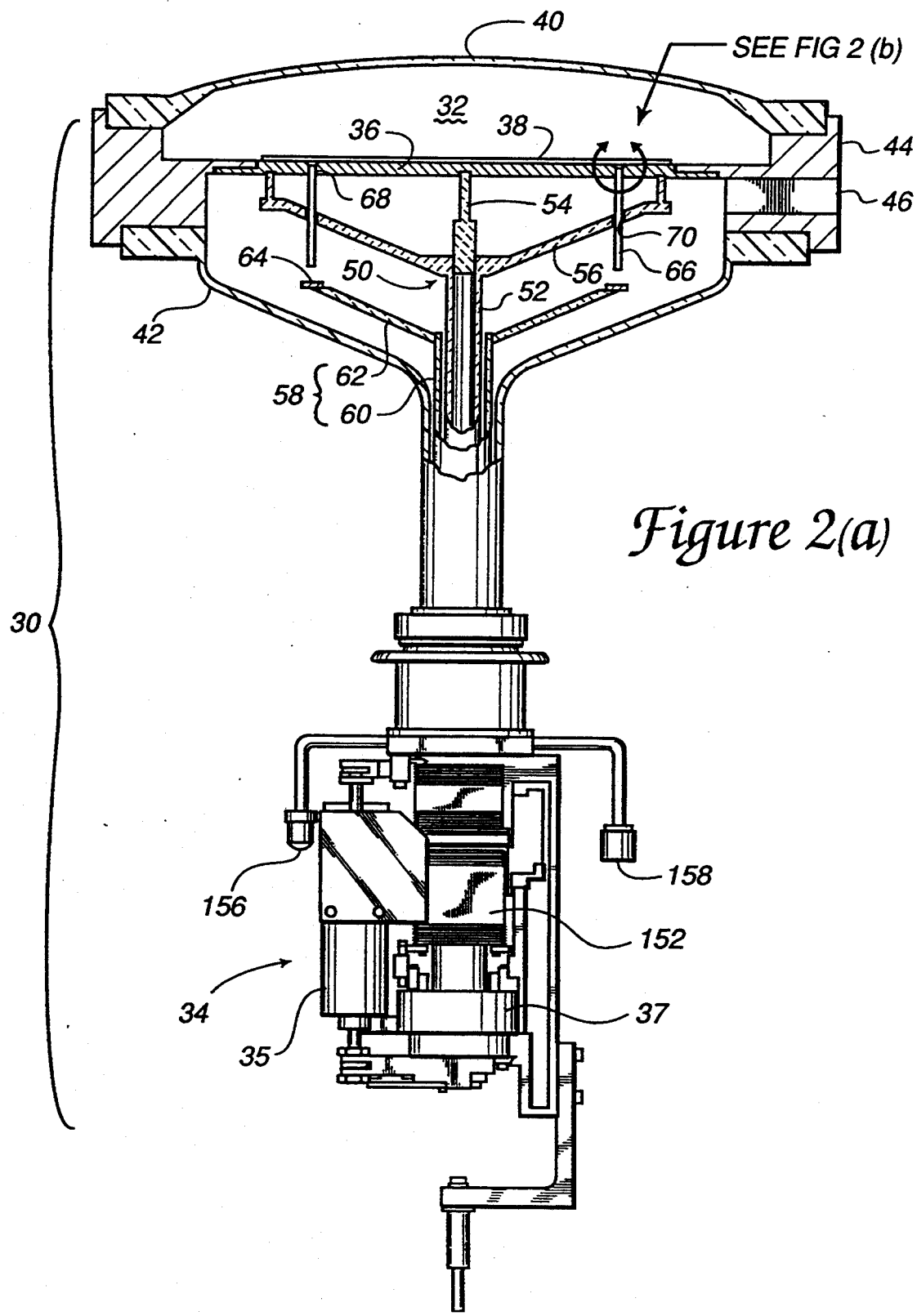
FIG. 2(a) is a cross-section through a schematic representation of a thermal reactor illustrating this invention.

In FIG. 2(a) a thermal reactor, generally indicated as 30, which embodies this invention, is illustrated. The reactor 30 is shown to include a reaction chamber 32 and a drive mechanism, generally indicated as 34, which includes a displacer 35 for moving the susceptor up and down and a rotary drive 37 for rotating the susceptor both of which will be described below with reference to FIGS. 5 and 6.

The reactor 30 further incorporates standard elements such as upper and lower quartz windows 40 and 42, respectively, a stainless steel base ring 44 and a robot arm access port 46 formed through the base ring 44. Semiconductor processing gases are injected into the reaction chamber 32 and heat supplied thereto by conventional means.

The reaction chamber 32 houses a susceptor 36 which supports a wafer 38 thereon. As has been described previously the susceptor 36 is rotated during the semiconductor processing operations. This is done by the rotary drive 37 of drive mechanism 34 which rotates a hollow drive shaft 52 to rotate a susceptor support and drive cradle 50 which, in turn, rotates the susceptor. The cradle 50 includes a centering pin 54, three support arms 56 (only two are shown), and three susceptor support pins 57, one of each of which is located at the end of each arm 56. All the components of the cradle and the drive shaft are formed of clear quartz. The arrangement of these components with respect to the susceptor will be described further below with reference to FIG. 2(c).

Also illustrated in this figure is a wafer support cradle 58 which includes a hollow shaft 60 which has an inner bore sufficiently large to accommodate the drive shaft 52. The wafer support cradle 58 also includes three (although only two are shown) arms 62 at the free end of each of which a flat pad 64 is located. During the wafer transfer process, each pad 64 is located directly below a wafer support pin 66.

The wafer support pins 66 pass through holes 68 in the susceptor and holes 70 in the support arms 56 of the drive cradle 50. In this, the illustrated wafer processing configuration, the pins 66 hang clear of the pads 64 and are held in this position by the susceptor 36.

Although it is not apparent from this figure, only the drive cradle 50 is able to rotate. On the other hand, both the drive cradle 50 and the support cradle 58 are able to move vertically up and down. As will be described below, this is achieved by the selective operation of different components of the displacer 35.

The manner in which the pins 66 are supported by the susceptor 36 is illustrated in greater detail in FIG. 2(b) in which it can be seen that the pin 66 hangs from the susceptor by means of a frusto-conical head 72 which fits snugly into a complemental, countersunk hole 74 formed from the top of the susceptor 36. As a result of this arrangement the head 72 provides a fairly good seal against the interior walls of the countersunk hole 74 thereby preventing processing gases from passing between the pin 66 and the interior walls of the hole 68 and burning the underside of the wafer 38. In addition to that, the head 72 is dimensioned so that its upper surface is flush with the upper, wafer receiving surface of the susceptor 36 thereby presenting a uniform wafer support surface.

In FIG. 2(c) the underside of the susceptor 36 is shown with the susceptor support and drive cradle 50 superimposed thereon in broken lines. As can be seen, the susceptor 36 has a cavity 78, formed at its center, which serves to receive the centering pin 54 of the susceptor support and drive cradle 50. In addition, the underside of the susceptor 36 has a pair of pockets 80 and an oval shaped cavity 82 formed therein. The pair of pockets receive two of the pins located at the ends of the support arms 56 of the support cradle 50 and the oval shaped cavity 82 receives the third such pin. The pockets 80 are individually much larger in diameter than the outer diameter of the pins and serve only to provide a level support for the susceptor 36. The orientation of the susceptor is, however, provided by a combination of the centering pin 54 located in its cavity 78 and the third pin 55 located, with a relatively small tolerance in the oval shaped cavity 82. It is this third pin which, as the drive shaft 52 (not shown in FIG. 2(c))

rotates, imparts rotary motion to the susceptor. As the susceptor 36 merely rests on and rotates with the pins 55 and centering pin 54 no abrasion of the susceptor occurs. As a result, unwanted particles are not generated.

Once the wafer has been processed within the reaction chamber 32 it is removed therefrom by a robot arm which enters the reaction chamber 32 through a robot arm access port 46.

Figure 3:
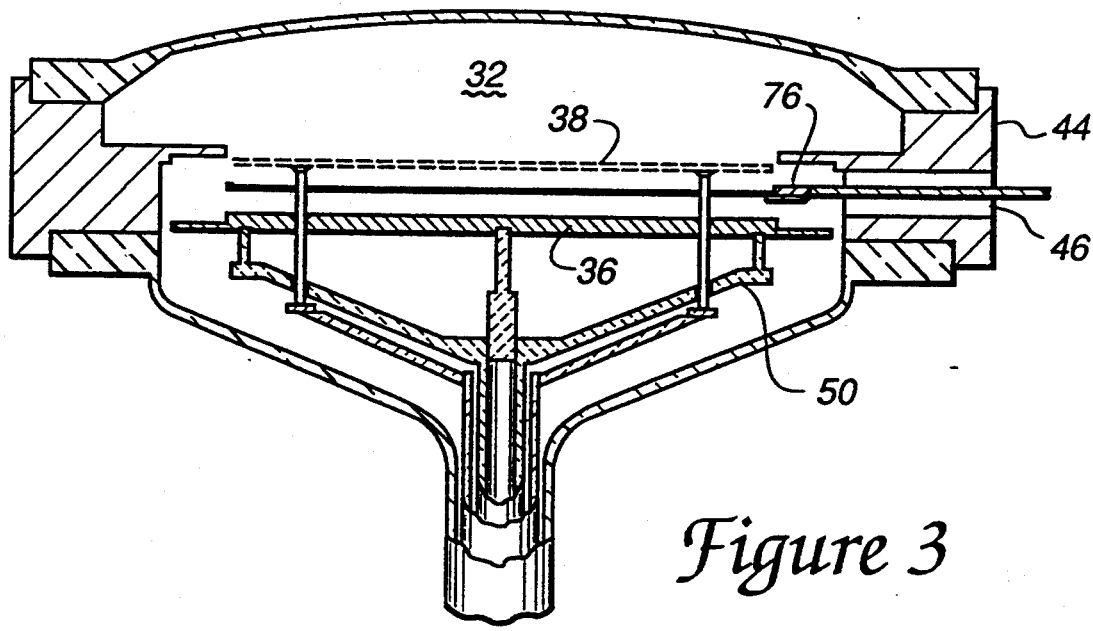
FIGS. 3 and 4 are cross-sections through the top part of the thermal reactor shown in FIG. 2 illustrating the wafer transfer process.

This wafer removal is a two-step process the first step of which is illustrated in FIG. 3. The susceptor support arm and drive cradle 50 is moved vertically down from the position indicated in FIG. 2(a) to that indicated in FIG. 3. As this happens, the pins 66, which are hanging from the susceptor, move downwards until their free ends rest on the support pads 64. At this point the pins stop moving downwards and, as they are located below the wafer 38, the wafer is supported by the pins and also stops moving downwards. The susceptor 36, however, continues to move downwards until it and the wafer are sufficiently spaced apart to allow a robot arm 76 to enter the access port 46 and be positioned directly below the wafer 38.

Figure 4:
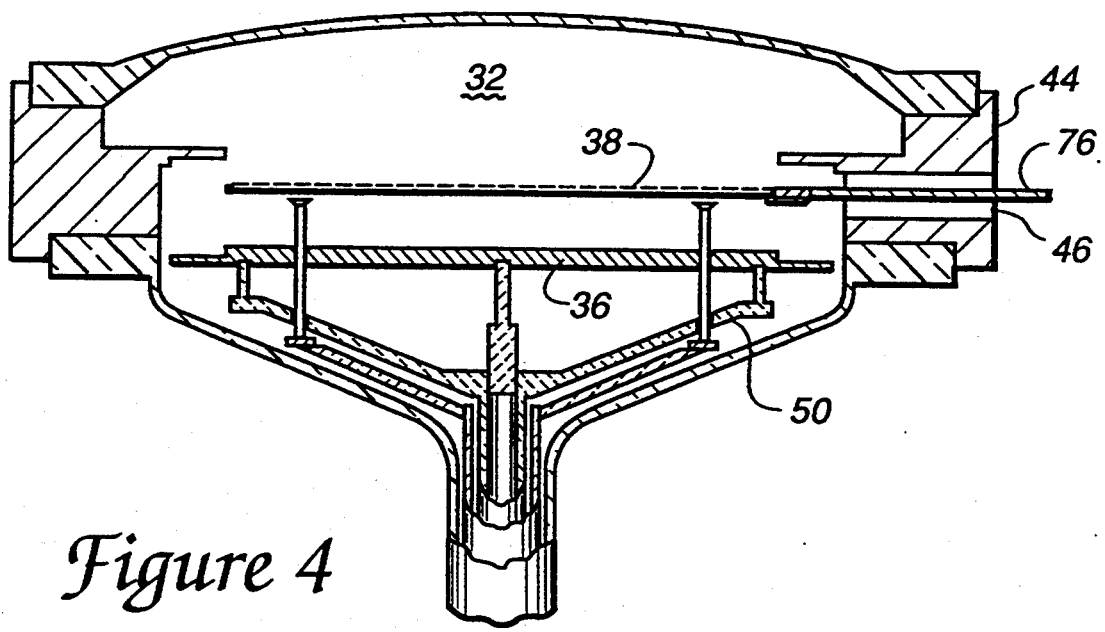

At this point, the next step, which is illustrated in FIG. 4, occurs. Once the robot arm 76 is in place both the susceptor support cradle 50 and the wafer support cradle 58 move downwards together. The wafer 38 follows this downward movement until it comes to rest on the robot arm 76. However, the two cradles 50, 58 continue to move downwards and so the heads 72 of the pins 66 move clear of the wafer 38. This allows the robot arm 76 to remove the wafer 38 from the reaction chamber 32.

Thereafter the robot arm 46 brings an unprocessed wafer back into the chamber and the above process is reversed to bring the wafer into the processing position indicated in FIG. 2(a).

Figure 5:
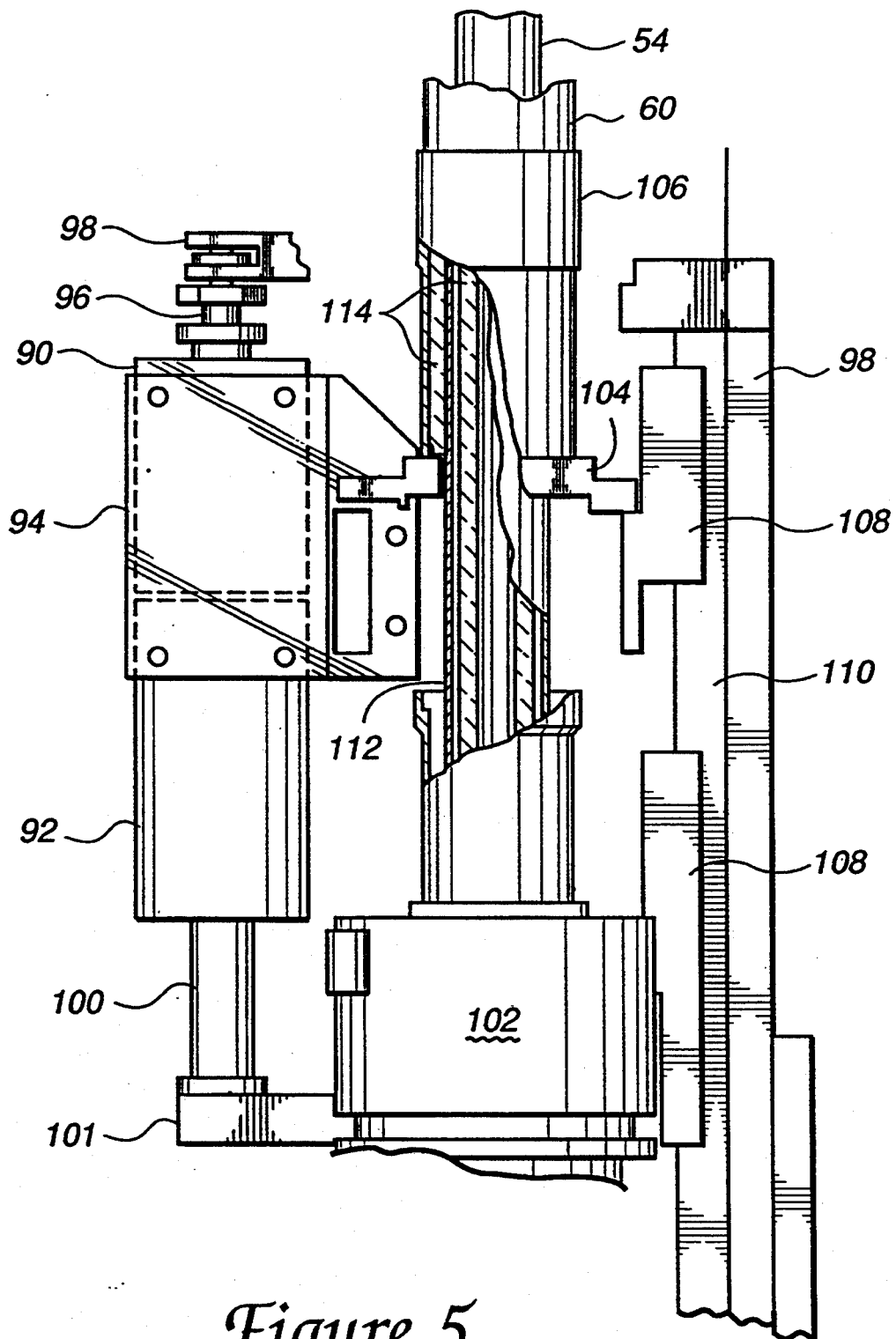
FIG. 5 is a partial cross-section illustrating the drive and lift mechanism for moving the susceptor and wafer vertically in the thermal reactor of FIG. 2.

Turning now to FIG. 5, the details of the vertical displacer 35 can be more fully explained. In this figure only the components which are necessary to describe how the susceptor support cradle 50 and wafer support cradles 58 are moved vertically up and down are illustrated. The remaining parts are either illustrated in FIG. 6 or omitted for clarity.

The displacer 35 is shown to include upper and lower pneumatic cylinders 90 and 92 respectively, which are fixed to one another by means of a bracket 94. Piston 96 of the upper cylinder 90 is secured to a rigid immobile support frame 98 (of which only the relevant parts are shown) and piston 100 of the lower cylinder 92 is connected directly to the base 102, by means of connector 101. In addition to bracketing the cylinders 90, 92 together, the bracket 94 is connected to a stainless steel support ring 104 which supports both the base of the shaft 60 (of the wafer support cradle 58) and an outer stainless steel sheath 106.

The base 102 and the supporting ring 104 are respectively secured to runners 108 which are mounted on a slide 110. The slide is, in turn, mounted on the same rigid support frame 98 to which the piston 96 is secured. This arrangement allows the entire drive mechanism as well as individual parts thereof to slide vertically up and down with respect to the rigid frame 98.

The first step of the wafer removal process (illustrated in FIG. 3) consists primarily of the vertical downward movement of the susceptor support cradle 50. This is achieved by causing the lower pneumatic cylinder to extend its piston 100 thereby moving the base 102 downwards. As the base 102 supports the drive shaft 52, the drive shaft 52 also moves downwards to bring the susceptor support cradle 50 into the position shown in FIG. 3). As the upper cylinder 94 is fixed to the rigid support frame 98, the bracket 94 does not move downwards and therefore the shaft 60 of the wafer support cradle remains stationary.

Once the robot arm 46 has been inserted under the wafer, the second step (illustrated in FIG. 4) can be commenced. To do this, the upper pneumatic cylinder 90 extends its piston 96. As this piston 96 is secured to the rigid frame 98, this causes the upper cylinder 90 and, therefore, the bracket 94 to move downwards. As a result, the support ring 104, and consequently the shaft 60, is moved downward. Furthermore, as the lower pneumatic cylinder 92 is bracketed to the upper pneumatic cylinder 90, the lower cylinder is also moved downward causing the base 102 of the drive mechanism, as well as the drive shaft 52 supported by it, to move downward.

As will be apparent from studying this figure, the effect of this arrangement of cylinders and brackets is that the drive shaft 52 can be independently moved up and down relative to the shaft 60. On the other hand, the shaft 60 does not move independently of the drive shaft 52 and as it moves downwards, so too does the drive shaft.

As has been previously indicated, the base portion of the shaft 60 is enclosed in a stainless steel sheath 106. In a similar fashion the drive shaft 52 is enclosed in its own stainless steel sheath 112. Both sheaths 106, 112 provide stability for the respective ends of the shafts 60, 52 they support. To enhance this support and also prevent the shafts 60, 52 from rubbing against the sheaths 106, 112 a number of O-rings 114 are located, in grooves formed in the shafts, between the shafts and their respective stainless steel sheaths. These O-rings 114 also serve to provide airtight seals for the cavities between the sheaths and the shafts.

Figure 6:
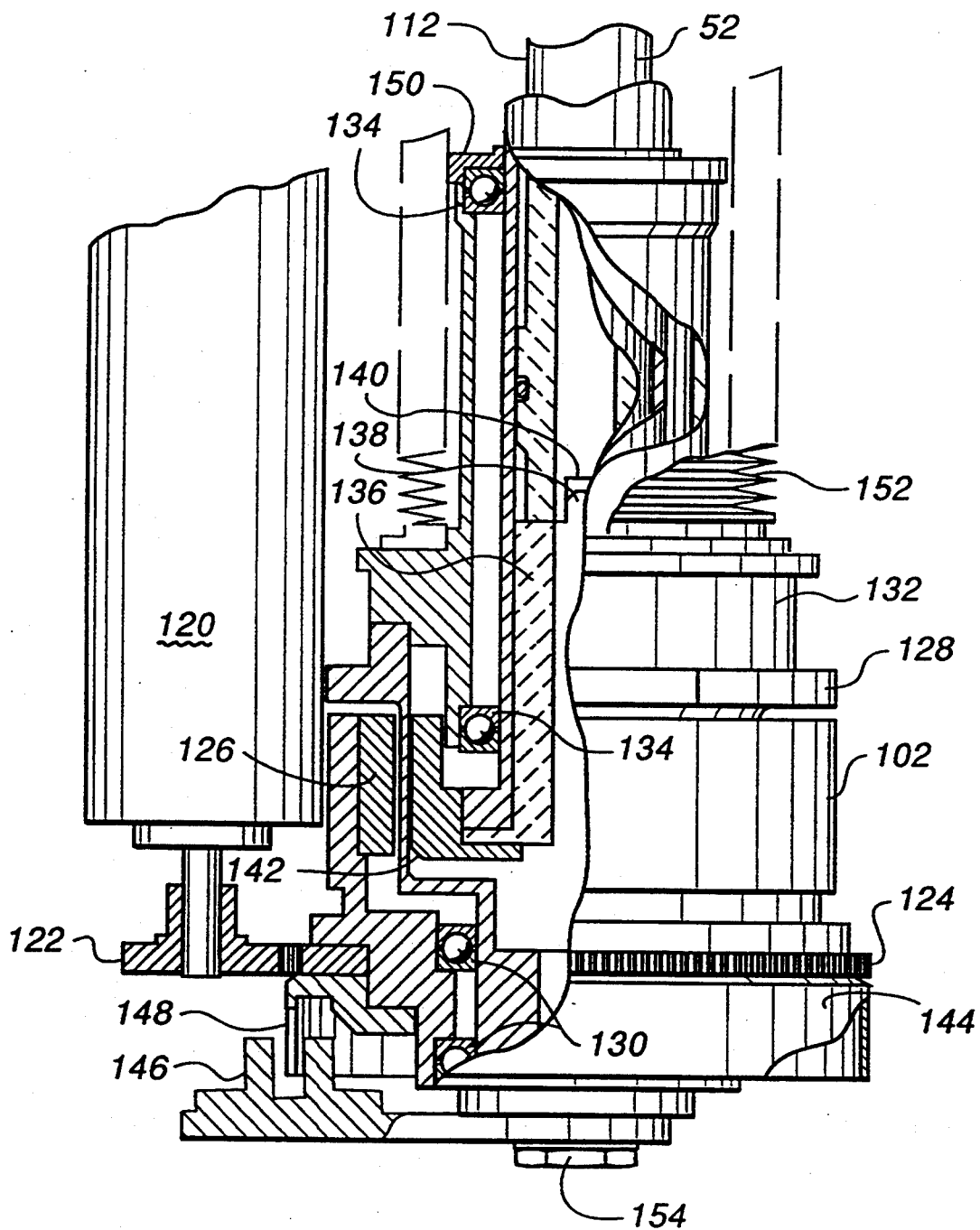
FIG. 6 is a longitudinal section in the plane of the paper of FIG. 5 illustrating the mechanism for rotating the susceptor within the thermal reactor.

Rotary motion is imparted to the drive shaft 60 and, accordingly, to the susceptor 36 by means of the mechanism illustrated in FIG. 6. This figure illustrates a pneumatic drive motor 120 which rotates a drive gear 122 and, thereby, imparts rotary motion to a ring gear 124 attached to the base 102. The base 102 is in the form of an upwardly open cup along the interior walls of which a ring of permanent magnets 126 is located. The base 102 is mounted to an interior pedestal 128 by way of two races of ball bearings 130. Although not evident from this figure, the interior pedestal is mounted to the slides 108 illustrated in FIG. 5 and is therefore restricted to move only in the vertical direction. This arrangement means that the pedestal 128 remains stationary while the base 102 is free to rotate around it.

The pedestal 128, in turn, supports a hollow column 132 inside which the drive shaft 52 and its encasing stainless steel sheath 112 are suspended. This is done by means of another two races of ball bearings 134, one of each of which is located at opposite ends of the hollow column 132. These races of ball bearings 134 allow the sheath 112 to rotate inside the hollow column 132.

The drive shaft 52 is located inside the sheath 112 and is supported by a base 136 made of a teflon-based material. The base 136 is fixed to the bottom part of the sheath and has a number of teeth 138 formed at its top end. These teeth 138 engage complemental slots 140 formed in the bottom of the drive shaft 52 allowing torque to be transferred from the base 136 to the drive shaft 52.

At the bottom of the sheath 112 a crown of elongate elements 142 made of magnetic material is located. Because of the arrangement described above and the dimensions of the elements located within the base 102, the crown 142 hangs free within the hollow pedestal 128 with a spacing of approximately 2.3 mm (0.09") between the exterior surface of the crown and the interior surface of the pedestal 128. Similarly, the exterior surface of the pedestal 128 is spaced from the interior surface of the permanent magnets 126. This configuration means that both the base 102 and the crown 142 are free to rotate with respect to the fixed pedestal 128 without any metal parts touching one another.

In operation, torque is transferred to the ring gear 124 from the motor 120 by means of gear 122. As the ring gear is secured to the base 102, the base rotates. As the base 102 rotates, so too does the ring of permanent magnets 126 which, in turn, rotates the crown 142 (and base 136 and shaft 52) by imparting magnetic forces to it. In this way, rotary motion is imparted to the susceptor 36 with the minimum amount of metal on metal contact and therefore the minimum amount of contaminating metal particle generation.

This figure also illustrates a number of other features of this invention:

The ring gear 124 has a circular skirt 144 extending downward from it. This skirt 144 rotates through a groove formed in a position sensor 146 which is secured to the stationary pedestal 128. The position sensor 146 operates by detecting light beamed from one side of the groove to the other. A single slot 148 is formed in the skirt 144 and, when this slot is aligned in the groove of the position sensor 146, light can pass from one side of the groove to the other. At all other positions of the skirt 144 this light signal is interrupted.

At the end of a processing cycle a signal is given and the position sensor 146 is activated. When the slot 148 in the skirt 144 comes into alignment with the position sensor 146 the position detector senses this (as described above) and a second signal is produced and the motor 120 is stopped thereby terminating the rotation of the drive shaft and susceptor 36. As only a single slot 148 is formed in the skirt 144, the susceptor always stops in exactly the same position. This is important because the wafer support cradle does not rotate and alignment between the pads 64 and the bottoms of the pins 66 needs to be achieved each time the processing operation is terminated.

This figure also shows that the upper race of the pair of races of ball bearings 134 is capped with a seal 150. Although this seal is not airtight, it prevents particles, that may be generated within the volume between the exterior wall of the sheath 112 and a stainless steel bellows 152, from passing into the space between the sheath and the interior of the hollow column 132.

The bellows 152 allow the vertical up and down movement described with reference to FIG. 5 to occur whilst at the same time provide protection to the elements described in both this figure and FIG. 5.

Finally, it should be noted that a continuous hollow cavity exists down the center of the drive shaft 52, the base 136 and the pedestal 128. The cavity is stopped at its exit point in the pedestal 128 by means of a plug 154.

Because of this arrangement, a vacuum drawn in the reaction chamber 32 also produces a vacuum within this and all other cavities between the pedestal 128 hollow column 132 and bellows 152 and the sheath 112. To prevent this vacuum from being broken, particular attention must be given to sealing the interfaces between the various parts and this is accomplished by O-rings, many of which are not illustrated in either FIGS. 5 or 6 but whose location will be apparent to those skilled in the art.

All these cavities are, after wafer processing has been completed, flushed with nitrogen which is provided from a source (not shown) through a supply port 156 shown in FIG. 2(a). The path of this nitrogen is from this port 156 into the space between the bellows 152 and the shaft 60 past the seal 150 and the upper of the pair of races of ball bearings 134 and into the space between the sheath 112 and the pedestal and hollow column 128, 132. From there the nitrogen is able to pass along the continuous hollow cavities leading up to the thermal reactor from where it can be removed. Alternatively, it can be removed from a nitrogen removal port 158 also illustrated in FIG. 2(a).

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A thermal reaction chamber for semiconductor wafer processing operations comprising:
    (i) a susceptor for supporting a semiconductor wafer within the chamber;
    (ii) displacer means for displacing the susceptor vertically between at least a first and a second position;
    (iii) a plurality of wafer support elements, each of which is suspended to be vertically moveable with respect to the susceptor and each of which extends beyond the underside of the susceptor; and
    (iv) means for restricting the downward movement of the wafer support elements whereby,
    as the susceptor is displaced from its first position through an intermediate position before the second position, the means for restricting operate to stop the continued downward movement of the wafer support elements thereby causing the elements to move vertically upwards with respect to the downwardly moving susceptor and separate the wafer from the susceptor.

2. A thermal reactor as recited in claim 1, further comprising means for imparting rotary motion to the susceptor.

3. A thermal reactor as recited in claim 2, wherein the susceptor has a plurality of apertures formed vertically therethrough and wherein the wafer support elements are suspended within the apertures formed through the susceptor.

4. A thermal reactor as recited in claim 3, wherein the means for restricting the downward movement includes a wafer support cradle positioned below the susceptor whereby,
    when the susceptor is in its first position, the wafer support elements are suspended clear of the cradle and as the susceptor moves through the intermediate position the wafer support elements are engaged by the cradle and prevented from continuing to move downward.

5. A thermal reactor as recited in claim 4, wherein said displacer means is also operable to displace the cradle vertically downward.

6. A thermal reactor as recited in claim 5, wherein said displacer means is operable to displace the cradle vertically downward whilst simultaneously displacing the susceptor from the second position to a third, lower position.

7. A thermal reactor as recited in claim 6, wherein each said wafer support element is constituted by a pin having an enlarged head and a body and wherein the head is, in the first position of the susceptor, located in an enlarged portion of its respective aperture and the body of the pin is suspended below said enlarged portion.

8. A thermal reactor as recited in claim 7, wherein the head of each pin is frusto-conical in shape and the enlarged portion of the aperture is complementally shaped, such that, when the pin is suspended from the susceptor, the frusto-conical head seals against the interior of the enlarged portion of the aperture and substantially prevents the movement of semiconductor wafer processing gases through the apertures.

9. A thermal reactor as recited in claim 6, wherein the means for imparting rotary motion to the susceptor includes:
(i) a drive shaft for supporting and transferring rotary motion to the susceptor;
(ii) a motor; and
(iii) a torque transfer means for transferring torque from the motor to the drive shaft.

10. A thermal reactor as recited in claim 9, wherein the torque transfer means includes:
(i) a rotationally-fixed, hollow pedestal;
(ii) a cup rotationally which is mounted about the pedestal, which is engaged by the motor and which includes a first ring of magnetic elements disposed along its interior surface; and
(iii) a base which is rotationally mounted inside the hollow pedestal and which supports the drive shaft and which includes a second ring of magnetic elements disposed about its outer perimeter to be concentric with the first ring of magnetic elements, whereby when the cup is rotated by the motor, the first ring of magnetic elements transfers rotary motion to the second ring of magnetic elements, thereby rotating the drive shaft.

11. A thermal reactor as recited in claim 10, wherein the first ring of magnetic elements is constituted by permanent magnets and the second ring by elements of magnetic material.

12. A thermal reactor as recited in claim 11, wherein the displacer means includes:
(i) a first pneumatic cylinder for vertically displacing the cradle; and
(ii) a second pneumatic cylinder for vertically displacing the drive shaft; wherein
the first cylinder is attached to a fixed mounting and the second cylinder is attached to the first cylinder, so that operation of the first cylinder causes vertical displacement of the cradle and of the second cylinder thereby displacing the susceptor, while operation of the second cylinder causes only displacement of the susceptor.

13. A thermal reactor as recited in claim 2 wherein the susceptor further has a plurality of pockets formed in its operational underside and wherein the means for imparting rotary motion to the susceptor includes a susceptor drive cradle having a plurality of susceptor drive elements, each receivable in a corresponding one of the pockets formed in the underside of the susceptor, whereby the susceptor is aligned with respect to the means for restricting the downward movement of the wafer support elements, when the susceptor drive elements are received in the pockets.

14. A thermal reactor as recited in claim 13 wherein at least three pockets are formed in the operational underside of the susceptor and are arranged such that one pocket is located at and at least two pockets are displaced from the center of the underside of the susceptor.

15. A processing chamber for a substrate, comprising:
a substrate support for supporting a substrate and having a plurality of apertures formed in parallel therethrough; and
a plurality of pins movable relative to said substrate support within respective ones of said apertures between respective first positions whereat said pins support said substrate above said substrate support and respective second positions whereat said pins are held within said substrate support, said pins having bottom ends projecting below a bottom surface of said substrate support, said substrate being supportable by said substrate support when said pins are at said second positions; and
at least one support cradle member for selectively contacting said bottom ends of said pins for moving them between said first and second positions relative to said substrate support.

16. A processing chamber as recited in claim 15, wherein said substrate support with said pins attached is rotatable about an axis perpendicular to a top surface of said substrate support and disposed in a central position of said top surface and said at least one cradle member is stationary during a rotation of said support.

17. A processing chamber as recited in claim 15, wherein said apertures include countersunk portions adjacent to a top surface of said substrate support and wherein said pins having frusto-conical heads engageable with said countersunk portions.

18. A processing chamber as recited in claim 15, wherein said substrate support is vertically movable between
(i) a third position whereat said at least one support cradle member contacts said bottom ends of said pins and said pins are at said first positions and
(ii) a fourth position whereat said at least one support cradle member does not contact said bottom ends of said pins and said pins are at said second positions.

19. A processing chamber as recited in claim 18, wherein said at least one cradle member is comprised of a support cradle vertically movable independently of said substrate support.

20. A processing chamber as recited in claim 15, further comprising a thermal reaction chamber enclosing said substrate support and said at least one support cradle member.

21. A processing chamber as recited in claim 20 wherein the substrate support further has a plurality of pockets formed in its operational underside and wherein at least one cradle member includes a plurality of cradle elements, each receivable in a corresponding one of the pockets formed in the underside of the substrate support, whereby the substrate support is aligned with respect to the thermal reaction chamber, when the cradle elements are received in the pockets.

22. A processing chamber as recited in claim 21 wherein at least three pockets are formed in the operational underside of the substrate support and are arranged such that one pocket is located at and at least two pockets are displaced from the center of the underside of the substrate support.

23. A method of moving and supporting a wafer comprising the steps of:
inserting movable pins within respective apertures passing through a substrate support, said pins being engageable with said substrate support at a first position of said pins relative to said substrate support and having bottom ends projecting below a bottom of said substrate support;
moving at least one contact member vertically toward said substrate support relative to said substrate support to contact said bottom ends of said pins and thereafter to move vertically said bottom ends towards said substrate support, whereby top ends of said pins extend beyond a top surface of said substrate support for holding a substrate apart from said substrate;
moving said at least one contact member vertically away from said substrate support relative to said substrate support and out of contact with said bottom ends of said pins while said pins are holding said substrate, whereby said pins are held at said first position within said substrate support and said substrate is supported by said top surface of said substrate support.

24. A method as recited in claim 23, further comprising rotating said substrate support and said pins about a vertical axis passing through said substrate held by said top surface of said substrate support while said at least one contact member is not in contact with said pins.

25. A method as recited in claim 24, wherein said at least one contact member is not rotated during rotating step.

26. A method as recited in claim 23, wherein said two moving steps comprise moving said substrate support while holding stationary said at least one contact member.

27. A method as recited in claim 23, wherein said two moving steps comprising moving both said substrate support and said at least one contact member.

* * * * *